United States Patent
Ide et al.

(10) Patent No.: US 6,179,930 B1
(45) Date of Patent: *Jan. 30, 2001

(54) PULL-UP DRYING METHOD AND APPARATUS

(75) Inventors: Katsuya Ide; Kazuo Oike; Yasuhiro Kitagawa, all of Nagano (JP)

(73) Assignee: Seiko Epson Corporation (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/011,816
(22) PCT Filed: Jun. 13, 1997
(86) PCT No.: PCT/JP97/02065
§ 371 Date: Jun. 15, 1998
§ 102(e) Date: Jun. 15, 1998
(87) PCT Pub. No.: WO97/48129
PCT Pub. Date: Dec. 18, 1997

(30) Foreign Application Priority Data

Jun. 14, 1996  (JP) ................................... 8-154675

(51) Int. Cl.[7] ................................ B08B 3/00; B08B 3/10
(52) U.S. Cl. ...................... 134/19; 13/25.4; 13/25.5; 13/26; 13/32; 13/34; 13/35; 13/37; 13/61; 13/105; 13/135
(58) Field of Search ................... 134/19, 25.4, 25.5, 134/26, 32, 37, 34, 35, 61, 105, 108, 95.2, 135, 186

(56) References Cited

U.S. PATENT DOCUMENTS

| | | | |
|---|---|---|---|
| 4,722,752 | * 2/1988 | Steck | 134/25.4 |
| 4,960,141 | * 10/1990 | Lenck et al. | 134/61 |
| 5,071,488 | * 12/1991 | Takayama et al. | 134/34 |
| 5,331,987 | * 7/1994 | Hayashi et al. | 134/102.1 |
| 5,673,713 | * 10/1997 | Han | 134/56 R |
| 5,868,150 | * 2/1999 | Mohindra et al. | 134/135 |

FOREIGN PATENT DOCUMENTS

| | | |
|---|---|---|
| 2-288334 | 1/1990 | (JP) . |
| 3-22427 | 1/1991 | (JP) . |
| 3-220722 | 9/1991 | (JP) . |
| 3-126047 | 12/1991 | (JP) . |
| 4-44323 | 2/1992 | (JP) . |

* cited by examiner

Primary Examiner—Zeinab El-Arini
(74) Attorney, Agent, or Firm—Harness, Dickey, & Pierce, P.L.C.

(57) ABSTRACT

A new drying method and apparatus is provided for drying a semiconductor device substrate, a liquid crystal panel substrate, or the like, which can reduce the possibility of contamination during drying, reduce facility costs and the area required for setting the facilities, and can perform drying in batches. Of the four sides of the upper end of the pull-up bath 10, two of the sides that oppose each other have a smaller height than the remaining two sides, and form overflow portions 10a where water in the pull-up bath overflows into a drainage bath 20. A rod-shaped heater 11 is mounted to the inside of the pull-up bath 10, and a heater cover 12 is disposed above the heater 11, with a pair of exhaust tubes 13 being led out to a location above the pull-up bath 10 so as to allow discharge of gas to the outside therefrom. A water supply tube 14 is connected to the bottom surface of the pull-up bath 10 to allow ultra-pure water to be supplied from a water supply system to be described later. A drainage tube 21 is connected to the lower portion of the drainage bath 20, as well as to a water supply control device 22, composed of a circulating pump, a change-over valve, or the like.

16 Claims, 6 Drawing Sheets

PULL-UP DRYING METHOD AND APPARATUS

This is a national stage application of PCT/JP97/02065 filed Jun. 13, 1997.

TECHNICAL FIELD

The present invention broadly relates to a pull-up drying method and apparatus, and, more particularly, to a drying technique suitable for drying a member, such as a semiconductor device substrate, liquid crystal panel substrate, or the like, that must satisfy a strict standard of cleanliness.

BACKGROUND ART

Conventionally, when, for example, a semiconductor device substrate or a liquid crystal panel substrate is moist after the cleaning process, dirt remains on the substrate, bacteria multiply on the substrate, or the like. Thus, in order to completely remove the moisture of the substrate, the substrate must be dried after the cleaning process.

Methods of drying a substrate include a spin dryer drying method in which moisture is removed from the substrate by making use of centrifugal force produced as a result of rotating a spinner at a high speed; a steam drying method in which water, which has clung onto the substrate due to isopropyl alcohol (IPA) steam having excellent compatibility with respect to water, is removed by substituting the water on the substrate with IPA; and an air knife drying method in which moisture of the substrate is removed by high-pressure air.

Of the aforementioned conventional drying methods, the spin dryer drying method and the air knife drying method have the problem that the once-removed water droplets turn into mist, which clings onto the substrate again due to circulating current in the apparatus. When mist is produced, contaminants may get mixed in the mist due to wind pressure, and the resulting contaminated mist may cling onto the substrate, thereby contaminating it. In addition, when these methods are used, the substrate may get electrically charged due to high-speed rotation and high-pressure air.

In addition, when the spin dryer drying method is used, the center portion of the substrate may become negatively charged as a result of high-speed rotation, and thus attract outside air, which contaminates the center portion of the substrate.

The steam drying method requires a facility for controlling IPA which is a flammable solvent, a coolant recovery facility, a facility for maintaining the purity of the IPA, or the like, so that facility costs are increased, and a larger area is required for setting the facilities.

When the air knife drying method is performed, the substrates must be dried one at a time, so that a plurality of substrates cannot be dried all at once in batches, resulting in poor drying efficiency. In addition, the air knife drying method requires a conveyance mechanism and a maintenance mechanism, which may produce dust that contaminates the substrates.

Accordingly, in view of the above-described problems, it is an object of the present invention to provide a new drying method and apparatus capable of reducing the possibility of contamination during drying, reducing facility costs and the setting area, and drying substrates in batches.

DISCLOSURE OF THE INVENTION

To this end, according to one aspect of the present invention, there is provided a pull-up drying method in which water in a water bath is heated to a predetermined temperature, and with the water surface kept still, a member to be dried is placed in the water once, and then pulled up at a predetermined speed.

According to this method, when the member in the water heated to a predetermined temperature is pulled up from a still water surface, water droplets can be completely removed from the surface of the member as a result of surface tension and natural evaporation of the water, so that the member can be gently dried, using an apparatus having a simple structure, instead of performing high-speed rotation, using a solvent, or making use of high-pressure air currents.

In a preferred form of the present invention, air currents may be generated so as to flow downward from above the water bath, while the member is being pulled up.

According to this form of the present invention, removal of water from the surface of the member due to surface tension is assisted by the downwardly-flowing air currents, and the downwardly-flowing air currents speed up natural evaporation, thereby allowing the member to be dried much more easily.

In still another preferred form of the present invention, the predetermined temperature may be in the range of not less than about 60° C. to less than the boiling point. In still another preferred form of the present invention, the predetermined speed may be not more than about 200 mm/min.

In these forms of the present invention, when the water temperature is set at a rather high value, or the pull-up speed is set at a low value, it is possible to reliably prevent water droplets from clinging onto the surface of the member.

In still another preferred form of the present invention, when the member is a polygonal plate member, the member, whose plate surface is set parallel to a direction in which the member is pulled up, may have a lower side of the plate surface tilted with respect to the water surface in order to pull up the member in a tilted posture.

In this form of the present invention, the member is pulled up by tilting the lower side of the plate surface of the member, making it possible to prevent water droplets from remaining on the lower side of the member.

According to another aspect of the present invention, there is provided a pull-up drying apparatus comprising a pull-up bath having an overflow portion on at least part of the upper end of the pull-up bath so as to allow water to overflow from the interior of the pull-up bath; a drainage bath having a drainage opening at the outer side of the overflow portion of the pull-up bath; water-supply means for supplying water into the pull-up bath from below the water surface; a member pull-up mechanism for pulling up the member to be dried from below the water surface at a predetermined speed; and water temperature control means for controlling the water temperature in the pull-up bath.

The structure of the apparatus includes water supply means for supplying water from below the water surface, and allows water to overflow from the overflow portion of the pull-up bath, so that the apparatus, in addition to providing the above-described effects, is capable of continuously and constantly supplying water, without moving the water surface, and thus capable of maintaining its water-removing capability and cleanliness.

In a preferred form of the present invention, the water temperature control means may include a heater disposed in the pull-up bath, a heater cover for covering the heater from above the heater, an exhaust tube for allowing gas within the heater cover to escape out of the bath, and a heating control device for controlling the heating by the heater.

According to this form of the present invention, even if air bubbles are produced in the vicinity of the heater, these air bubbles are kept within the heater cover and discharged from the exhaust tubes, so that although the heater is placed directly in the pull-up bath, the air bubbles do not rise towards the water surface, making it possible to keep the water surface still. Thus, there are less water droplets on the member.

In another preferred form of the present invention, the heater cover may be shaped like a lampshade in cross section, and include a center portion for collecting gas produced in the vicinity of the heater, and the exhaust tube may include an exhaust opening disposed at the center portion.

According to this form of the present invention, since the heater cover is shaped like a lampshade, gas is more effectively kept at the center portion of the heater cover.

In still another preferred form of the present invention, the pull-up bath may have a pair of the overflow portions that oppose each other.

According to this form of the present invention, a pair of opposing overflow portions are provided, allowing the direction of water flow to be maintained in the direction of the overflow portions at all times. Therefore, a plurality of members can be placed in a direction perpendicular to the direction of flow of the water to reduce stagnation of the water, making it possible to preserve the cleanliness of the member.

In still another preferred form of the present invention, the apparatus may further comprise an air supply device disposed upwardly of the pull-up bath, and an exhaust opening may be placed around the upper end of the pull-up bath.

According to this form of the present invention, air currents flowing downward towards the pull-up bath can be generated, making it possible to speed up water removal from the surface of the member.

In still another preferred form of the present invention, the member pull-up mechanism may include a carrier for putting the member therein, and a carrier supporting portion for supporting the carrier in a tilted posture.

According to this form of the present invention, the member is pulled up in a tilted posture along with the carrier, making it possible to prevent water droplets from remaining on the bottom of the carrier and the bottom of the member.

BEST MODE FOR CARRYING OUT THE INVENTION

Figure 1:
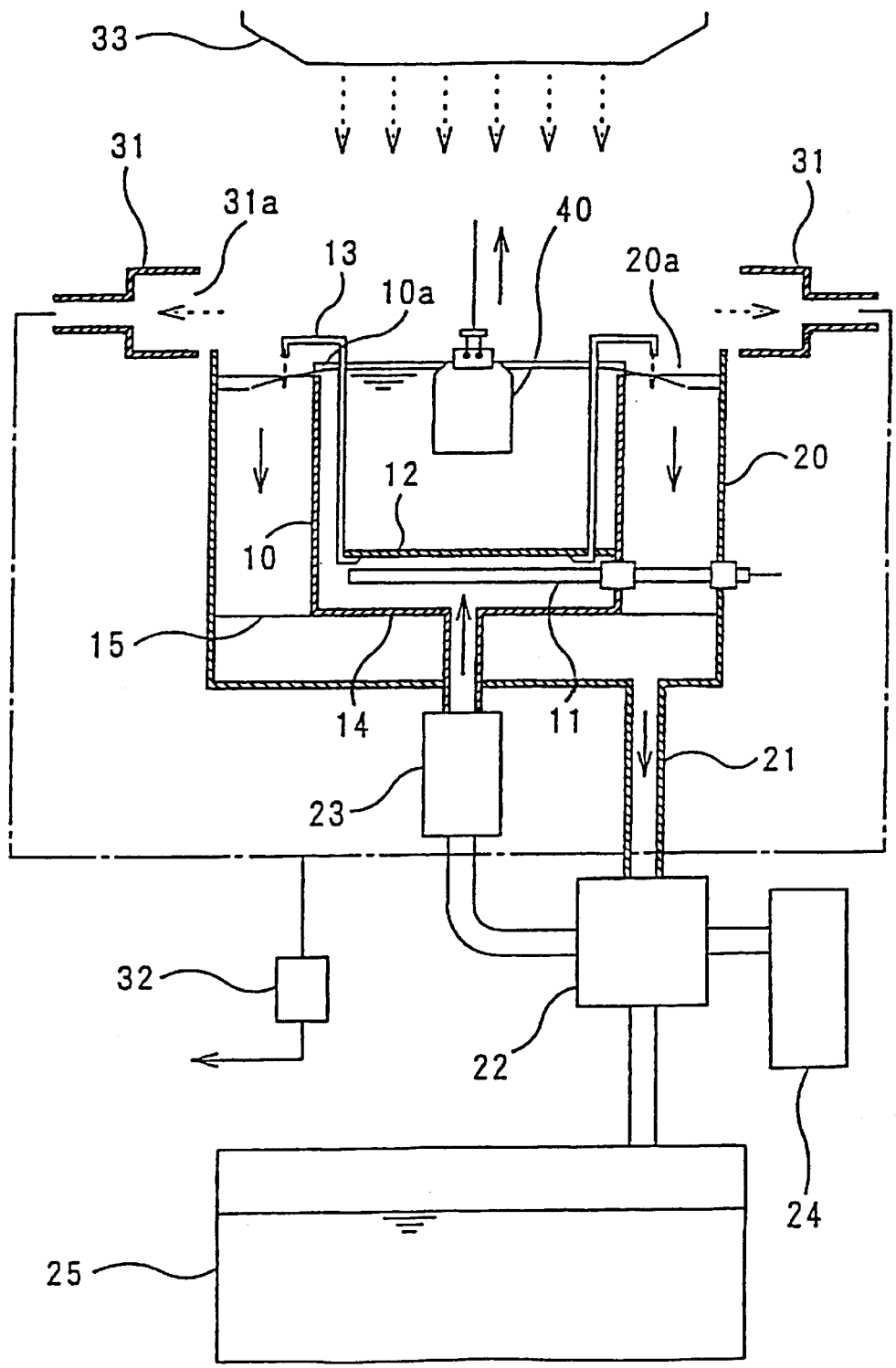
FIG. 1 is a vertical sectional view schematically showing the entire structure of an embodiment of a pull-up drying apparatus in accordance with the present invention.

A description will now be given of an embodiment of a pull-up drying method and drying apparatus in accordance with the present invention, with reference to the appended drawings. FIG. 1 is a schematic view showing the entire structure of an embodiment of a drying apparatus. At the center of the structure of the drying apparatus is disposed a pull-up bath 10 made of synthetic resin (such as vinyl chloride). The pull-up bath 10 is placed in a drainage bath 20 that is larger than the pull-up bath 10.

Figure 3:
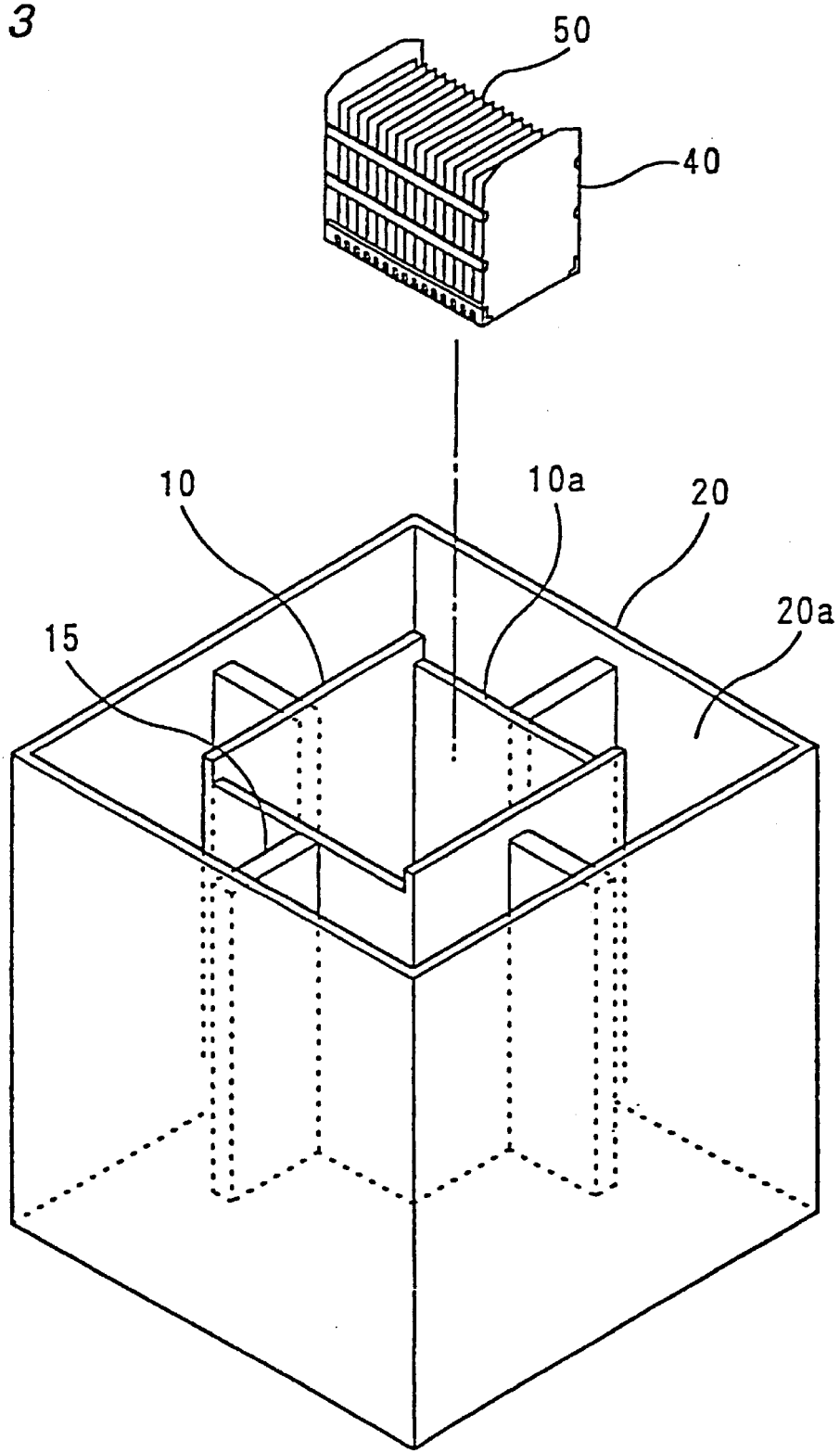
FIG. 3 is a perspective view schematically showing the pull-up bath and the drainage bath in the same embodiment in accordance with the present invention.

The pull-up bath 10 is square-shaped in horizontal cross section. As shown in FIG. 3, of the four sides of the upper edge of the pull-up bath 10, two of the sides that oppose each other have a smaller height than the remaining two sides, and form overflow portions 10a where water in the pull-up bath overflows into the drainage bath 20. A rod-shaped heater 11 is mounted to the lower inside portion of the pull-up bath 10. A heater cover 12, shaped like a lampshade in cross section, is disposed above the heater 11. A pair of exhaust tubes 13 are led out from the inside edge of the heater cover and rises to a location above the pull-up bath 10, so that they can allow discharge of gas to the outside. A water supply tube 14 is connected to the bottom surface of the pull-up bath 10 so as to allow ultra-pure water to be supplied from a water supply system described later.

The opening in the drainage bath 20 surrounding the pull-up bath 10 corresponds to drainage opening 20a for receiving water overflowing from the overflow portions 10a. A drainage tube 21 is connected to the lower portion of the drainage bath 20, as well as to a water supply control device 22, composed of a circulating pump, a change-over valve, or the like. The water supply control device 22 is connected to the water supply tube 14 through a filter 23, as well as to an ultra-pure water producing device 24 and a drain bath 25.

Exhaust ducts 31, each having an exhaust opening 31a, are mounted to the four sides of the upper end of the drainage bath 20, and are connected to an exhaust device (not shown) through a steam trap 32. An air supply device 33 with a clean filter is disposed above the pull-up bath 10, and is constructed to allow air, whose cleanliness has been controlled like the cleanliness of the clean room, can be supplied from above the pull-up bath 10. This construction allows clean air to always flow downward to the pull-up bath 10 from above the bath 10, when a carrier (described later) is being pulled up.

Figure 2:
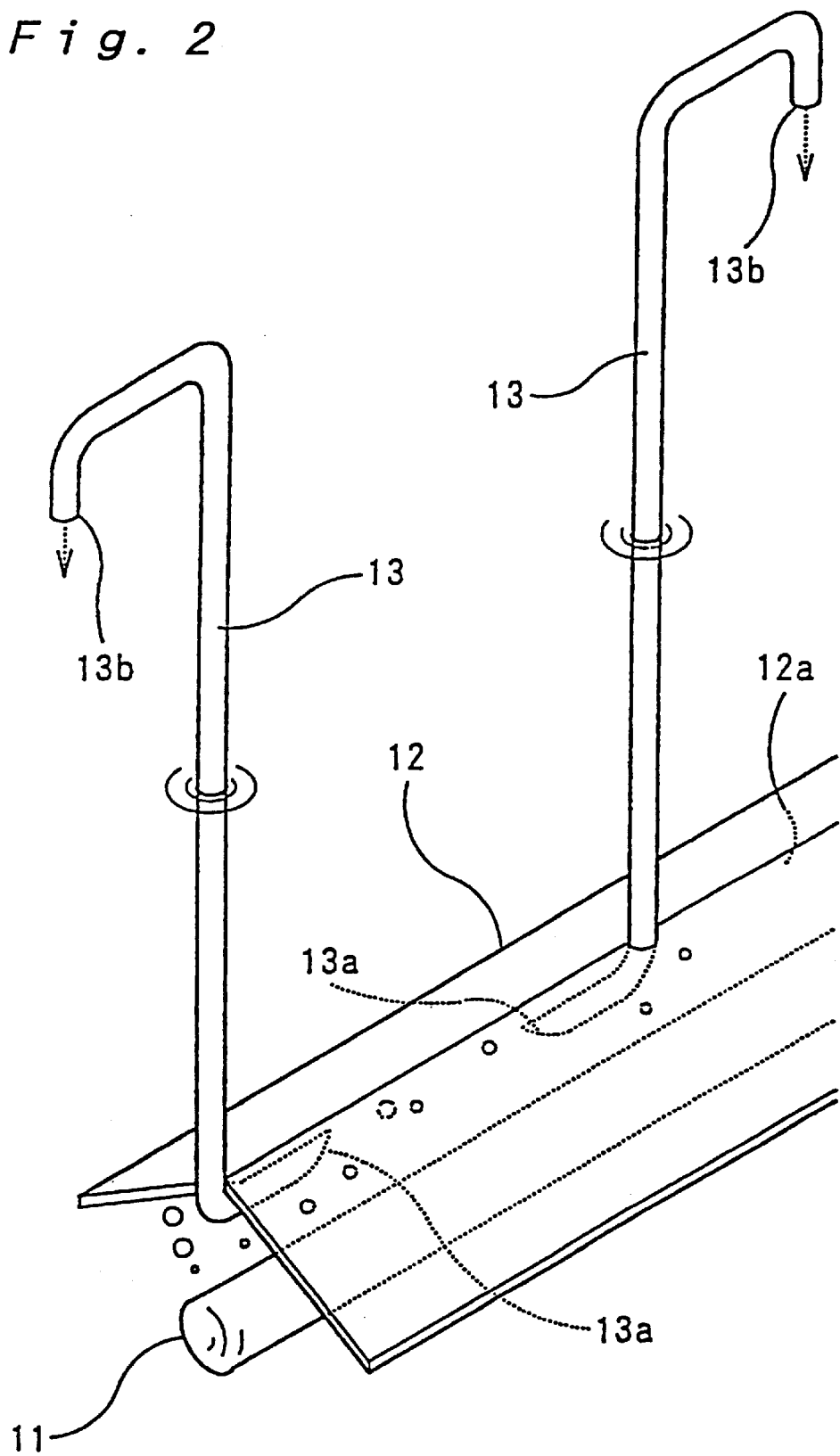
FIG. 2 is an enlarged perspective view showing the structures of the heater, the heater cover, and the exhaust tube in the same embodiment in accordance with the present invention.

FIG. 2 is a view showing the structures of the heater 11, the heater cover 12, and the exhaust tube 13 in the pull-up bath 10. The heater cover 12 is disposed above the heater 11, so that even when the water in the vicinity of the heater 11 boils, forming air bubbles, the air bubbles gather at an uppermost portion 12a located at the inside center of the heater cover 12. Exhaust holes 13a provided in each of the exhaust tubes 13 are disposed at the uppermost portion 12a. The vapor in the pull-up bath 10 flows into the exhaust tubes 13 from the exhaust openings 13a thereof, and out of the exhaust tubes 13 from the discharge openings 13b.

The heater 11 is connected to a heating control device (not shown) that is constructed to perform, by utilizing a known technique, temperature control based on the water temperature detected with a temperature sensor built in the heater 11, or with a temperature sensor separately mounted to a pull-up bath.

FIG. 3 is a perspective view showing the structural relationship between the steam pull-up bath 10 and the drainage bath 20. Supporting plates 15 are mounted vertically to the center of each of the four sides of the pull-up bath 10, as well as to the interior sides of the drainage bath 20. These supporting plates prevent the pull-up bath 10 from expanding as a result of heating of the water by the heater. With respect to the two opposing overflow portions 10*a* of the pull-up bath 10, substrates 50, put in a carrier 40 to be pulled up, are positioned such that their surfaces are parallel to the directions of the two overflow portions 10*a*. The substrates, positioned in this manner, are pulled up.

As described above, in the embodiment illustrated in FIGS. 1 to 3, the ultra-pure water, supplied from an ultra-pure producing device 24 by the water supply control device 22, flows to the bottom of the pull-up bath 10 via the filter 23, and then up through the pull-up bath 10 to the overflow portions where the water overflows and is collected in the drainage bath 20. Then, from the drainage tube 21, the water flows back into the water supply control device 22. While, at the water supply control device 22, the specific resistance of the discharged water is measured to monitor any reduction in purity, and the discharged water is circulated to the pull-up bath 10, a predetermined amount of a new supply of ultra-pure water is introduced by the ultra-pure water producing device 24, or part of the discharged water is discharged to the drain bath 25, as required. This maintains the purity of the ultra-pure water in the pull-up bath 10 at a constant value.

The carrier 40 holding the plurality of substrates is placed into the pull-up vessel 10 and then slowly pulled up. Here, as shown in FIG. 3, the posture of the carrier is controlled, such that the surfaces of the substrates 50 put in the carrier 40 extend parallel to the directions of the overflow portions 10*a*. This prevents stagnation of the water around the substrates 50, allowing them to be pulled up in a clean state.

Figure 4:
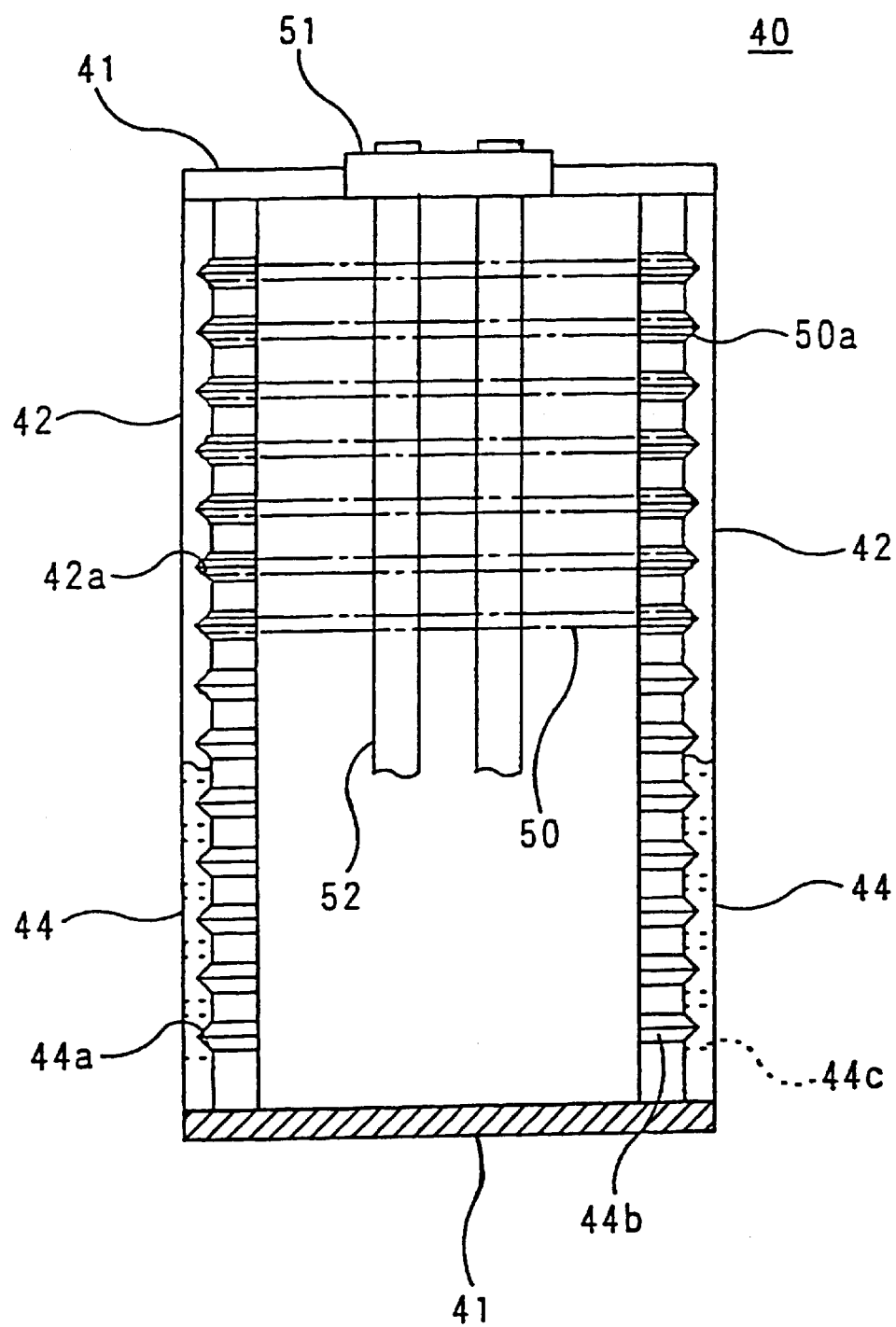
FIG. 4 is a sectional view showing a portion of the plane surface of the carrier in the same embodiment in accordance with the present invention.
Figure 5:
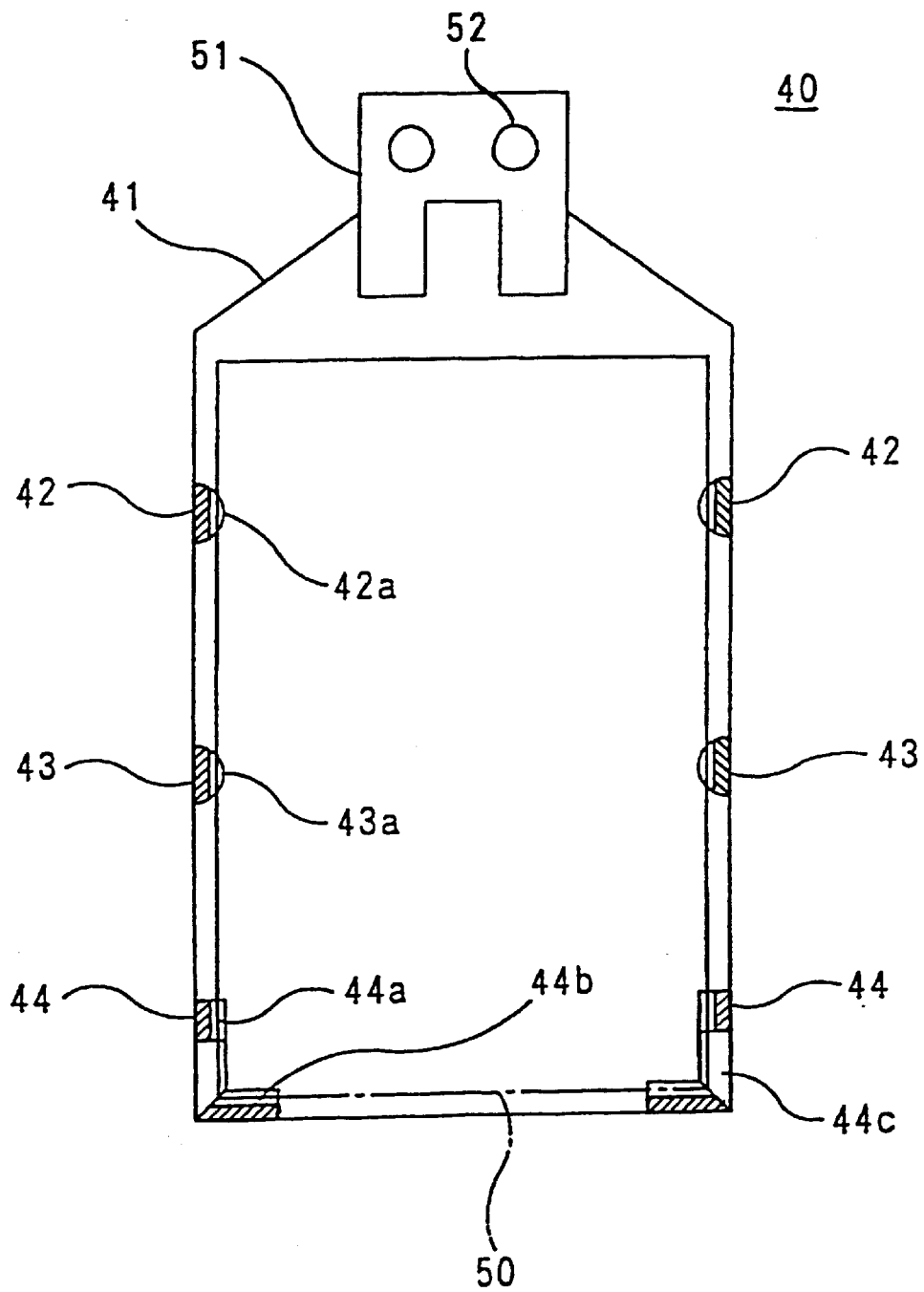
FIG. 5 is a vertical sectional view of the carrier in the same embodiment in accordance with the present invention.

FIGS. 4 and 5 are views each showing a structure of the carrier 40. The structure of the carrier 40 includes a pair of front and back supporting plates 41, a pair of semi-circular cross-section supporting frames 42 that are disposed between the supporting plates 41, a pair of supporting frames 43 also being semi-circular in cross section and disposed below the supporting frames 42, and a pair of supporting frames 44 being L-shaped in cross section and mounted to the lowermost portion of the supporting plates 41.

The supporting frames 42 and the supporting frames 43 are mounted such that their cylindrical surfaces face inwards, with their cylindrical surfaces being provided with supporting grooves 42*a* and supporting grooves 43*a*, respectively, that are V-shaped in cross section, are separated by fixed intervals, and extend in a vertical direction. In the L-shaped cross sectional structure of each supporting frame 44, the vertically-formed portion is provided with a V-shaped cross section supporting groove 44*a* extending in the vertical direction, while the horizontally-formed portion is provided with a V-shaped cross section supporting groove 44*b* extending in the horizontal direction. An oblong drainage hole 44*c* extending in the vertical direction is formed below each of the supporting grooves 44*a* of the supporting frames 44. The inner peripheral surface of the lowermost portion of each drainage hole 44*c* is sloped outwardly to allow easy drainage of water.

The rectangular substrate 50 of FIG. 5 is stably supported by the supporting grooves 42*a*, 43*a*, 44*a*, and 44*b* of the corresponding supporting frames 42, 43, and 44, such that the edges 50*a* (refer to FIG. 4) are in line contact with the inner surfaces of the corresponding sloped grooves that are V-shaped in cross section. Here, it is also possible to stably support them by point contact by forming the sloped inner surfaces of each of the supporting grooves so that they protrude.

Since it is only the edges that are in line contact with the carrier 40, stagnation of water on the substrates 50 occurs infrequently, and the substrates 50 are not easily contaminated. In addition, since the inner sides of each of the supporting frames 42 and the supporting frames 43 have cylindrically-shaped surfaces, and drainage holes 44*c* are formed in the lower portions of each of the supporting frames 44, water droplets do not tend to remain on the carrier 40, itself.

Figure 6:
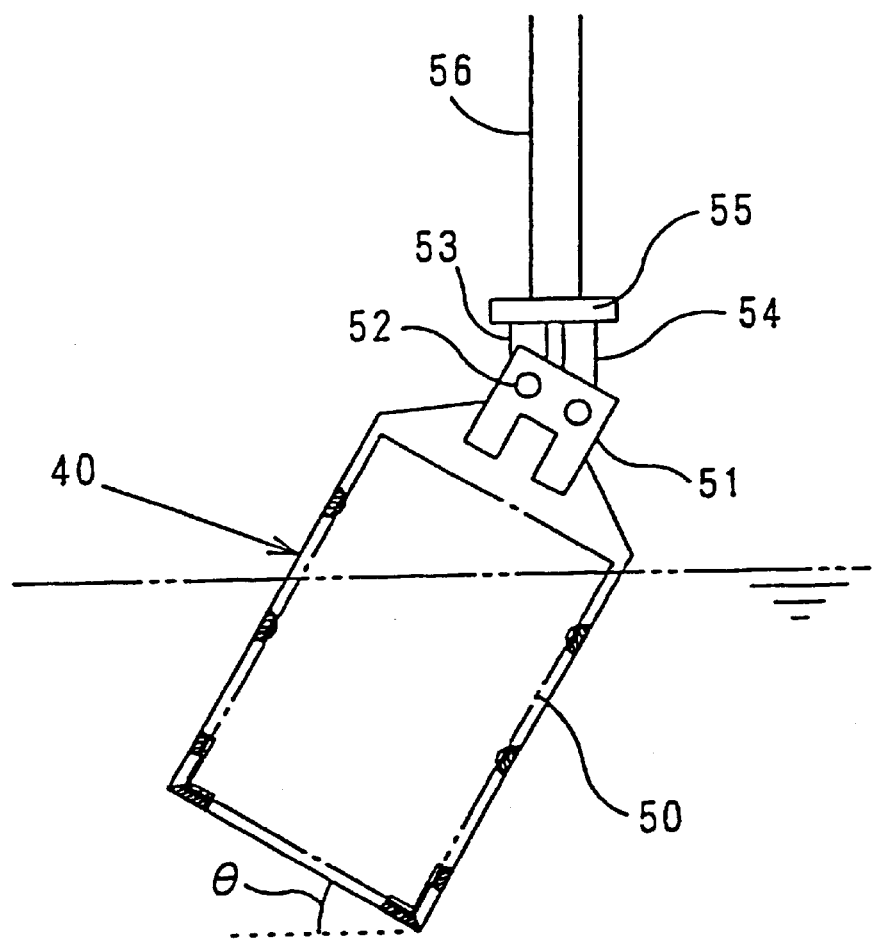
FIG. 6 is a view showing the carrier in a pulled-up state.

Suspension plates 51 are mounted to the supporting plates 41, with two supporting shafts 52 provided between the suspension plates 51. As shown in FIG. 6, two supporting members 53 and 54 are mounted to the supporting shafts, respectively, with a pulling plate 55 mounted to the supporting shafts 52 through these supporting members 53 and 54. A pulling rod 56, connected to a pulling mechanism (not shown), is connected to the pulling plate 55.

By virtue of the above-described construction, the carrier 40 with the plurality of substrates 50 can be pulled up slowly at a predetermined speed by the pulling mechanism (not shown). Here, the construction of the member pull-up means of the present invention includes the carrier 40 for putting the substrates 50 therein; the carrier supporting portion of FIG. 6 including the suspension plates 51 connected to the carrier 40, the supporting shafts 52, the supporting members 53 and 54, the pulling plate 55, and the pulling rod 56; and the aforementioned pulling mechanism.

When the carrier 40 is slowly pulled upward by means of the drying apparatus having the above-described construction, water on any of the substrates 50 starts to get removed from the upper portion thereof due to surface tension or natural evaporation, and is eventually nicely removed. Here, in order to dry a square-shaped substrate (for a liquid crystal panel or the like), such as that shown in FIG. 6, the substrate is slightly tilted by a predetermined angle θ with respect to the water surface, as shown in FIG. 6. When the substrate is tilted, water droplets do not tend to remain on the lower end side of the substrate, so that the moisture on the substrate can be completely removed. Pulling up the carrier 40 in a tilted position has the advantage of preventing water droplets from clinging onto the carrier itself. Here, the carrier 40 can be set in a tilted position by using different lengths for the supporting members 53 and 54 in accordance with the tilting angle, as shown in FIG. 6.

Since ultra-pure water is always circulated, and its purity is always maintained at a constant value by the above-described drying apparatus, the substrate is not easily contaminated. Air bubbles are removed by means of the heater cover 12 and the exhaust tube 13, and water is supplied from the bottom surface of the pull-up bath 10 (or from below the water surface rather than from the bottom surface), in order not to move the water surface to the extent possible. Since measures are taken not to move the water surface, and the substrate is pulled up slowly, it is possible to remove the water droplets completely from the surface of the substrate. In addition, natural evaporation, induced by heating of ultra-pure water, and satisfactory ventilation achieved by means of the exhaust duct 31 and the air-supply device 33, allows the substrate to be dried completely.

In the construction of the present embodiment, air currents constantly flow downward, when the carrier 40 is being pulled up. These air currents are used to assist in the removal of water from the carrier 40 and the substrate 50.

Table 1 gives the experimental results obtained from drying the substrate 50 using the apparatus of the present embodiment.

TABLE 1

A: Completely dried  B: Water droplets on top or bottom surfaces of substrate  C: Water droplets on entire substrate

| | Substrate setting orientation | Temperature (° C) | Pull-up speed (mm/min) | Distance between substrates (mm) | Evaluation |
|---|---|---|---|---|---|
| 1 | Tilted | 40 | 300 | 20 | C |
| 2 | Tilted | 50 | 300 | 20 | C |
| 3 | Tilted | 60 | 300 | 20 | C |
| 4 | Tilted | 70 | 300 | 20 | C |
| 5 | Tilted | 80 | 300 | 20 | C |
| 6 | Tilted | 90 | 300 | 20 | C |
| 7 | Tilted | 40 | 200 | 20 | C |
| 8 | Tilted | 50 | 200 | 20 | C |
| 9 | Tilted | 60 | 200 | 20 | B |
| 10 | Tilted | 70 | 200 | 20 | A |
| 11 | Tilted | 80 | 200 | 20 | A |
| 12 | Tilted | 90 | 200 | 20 | A |
| 13 | Tilted | 40 | 150 | 20 | C |
| 14 | Tilted | 50 | 150 | 20 | C |
| 15 | Tilted | 60 | 150 | 20 | B |
| 16 | Tilted | 70 | 150 | 20 | A |
| 17 | Tilted | 80 | 150 | 20 | A |
| 18 | Tilted | 90 | 150 | 20 | A |
| 19 | Tilted | 40 | 100 | 20 | C |
| 20 | Tilted | 50 | 100 | 20 | C |
| 21 | Tilted | 60 | 100 | 20 | B |
| 22 | Tilted | 70 | 100 | 20 | A |
| 23 | Tilted | 80 | 100 | 20 | A |
| 24 | Tilted | 90 | 100 | 20 | A |
| 25 | Tilted | 40 | 50 | 20 | C |
| 26 | Tilted | 50 | 50 | 20 | C |
| 27 | Tilted | 60 | 50 | 20 | B |
| 28 | Tilted | 70 | 50 | 20 | A |
| 29 | Tilted | 80 | 50 | 20 | A |
| 30 | Tilted | 90 | 50 | 20 | A |
| 31 | Tilted | 80 | 150 | 15 | A |
| 32 | Tilted | 80 | 150 | 10 | B |
| 33 | Tilted | 80 | 150 | 5 | B |
| 34 | Parallel | 80 | 150 | 20 | B |
| 35 | Parallel | 80 | 50 | 20 | B |

It can be seen from Table 1 that the substrate can be more easily dried, when it is tiled with respect to the water surface. In general, the tilting angle θ is preferably in the range of from 20 to 40 degrees. Thus, it is preferable that either one of the two lower sides of the substrate is disposed closer to the horizontal plane than the other, in order to prevent water droplets from remaining at the corners of the two sides. For a rectangular substrate 50 shown in FIG. 6, the most preferable tilt angle is about 30 degrees, so that the experimental results given in Table 1 are those for a tilting angle of about 30 degrees.

Pulling up the carrier 40 and the substrate 50, while they are tilted, prevents water droplets from remaining on the upper and lower edges, making it possible to prevent selective contamination of these locations.

The water temperature, though varying slightly with the condition, is preferably not less than about 60° C. This is because when the water temperature is increased up to a certain high value, it is possible to expect evaporation from the carrier 40 and the surface of the substrate 50.

Good results are obtained when the pull-up speed is not more than about 200 mm/min. when the pull-up speed is high, the pulled-up substrate has water droplets remaining on its surface. On the other hand, when the pull-up speed is low, water does not separate from the water surface, while the substrate is being pulled up, so that water droplets do not remain on the surfaces of the carrier 40 and the substrate 50.

With the substrate held in a tilted posture, when the temperature is set in the range of from 70° C. to 90° C., the pull-up speed is set at not more than 200 cm/min, and the substrate interval is set at not less than 15 mm, water droplets do not remain on the substrate 50, so that the substrate 50 is completely dried. When the temperature range exceeds 90° C., the water may on the whole boil, so that the temperature range is preferably not less than 60° C. and less than the boiling point, and most preferably not less than 70° C. and less than 90° C. The slower the pull-up speed, the better, but it is preferably in the range of about 50 to 200 mm/min, since as the pull-up speed decreases, slight movements in the water surface easily affect the water removal, and the processing time increases.

According to the present embodiment, the relatively small and cheap drying apparatus allows drying in a sufficiently-clean condition, drying of a plurality of substrates by placing them in a carrier, and efficient drying.

Industrial Applicability

As can be understood from the foregoing description, the present invention provides a new drying method and apparatus, which reduce the possibility of contamination during drying, reduces facility costs and setting area, allows batch drying, and are suitable for drying a member, such as a semiconductor substrate, a liquid crystal panel substrate, or the like, that must satisfy a strict standard of cleanliness.

What is claimed is:

1. A pull-up drying method in which water in a water bath is heated to a predetermined temperature, a member to be dried is placed in the water once, and then pulled up at a predetermined speed to dry, wherein the member has a plate surface which is perpendicular to a first pair of opposing sidewalls of said water bath which are shorter than a second pair of opposing sidewalls of said water bath and parallel to a direction the water flows to a pair of opposing overflow portions on an upper end of said first pair of opposing sidewalls of said water bath when placed in the water so that the water flows without stagnation from an interior of said water bath towards the overflow portions, and the member, whose plate surface is set parallel to a direction in which the member is pulled up, has a lower side of the plate surface tilted with respect to a surface of the water while being pulled up in order to pull up the member in a tilted posture.

2. A pull-up drying method according to claim 1, wherein air current is generated so as to flow downward from above the water bath, while the member is being pulled up.

3. A pull-up drying method according to claim 1, wherein the predetermined temperature is in a range of not less than about 60° C. to less than a boiling point of the water.

4. A pull-up drying method according to claim 1, wherein the predetermined speed is not more than about 200 mm/min.

5. A pull-up drying method according to claim 1, wherein the member is a polygonal plate member.

6. A pull-up drying method according to claim 1, wherein said member further comprises a batch of members which are placed in the water and pulled up.

7. A pull-up drying apparatus comprising a pull-up bath having a four sidewalls including two opposing sidewalls which are shorter than the other two sidewalls, the two shorter sidewalls defining a pair of opposing overflow portions on at least part of an upper end of said pull-up bath so as to allow water to overflow from an interior of said pull-up bath; a drainage bath having a drainage opening at an outer side of said overflow portion of said pull-up bath; water-supply means for supplying water into said pull-up bath from below a surface of the water while keeping said surface still; a member pull-up mechanism for pulling up the member to be dried from below the water surface at a predetermined speed, said member pull-up mechanism including a carrier for putting the member in such that a plate surface of the member is perpendicular to said two shorter sidewalls and parallel to a direction the water flows to the overflow portions when placed in the water so that the water flows without stagnation from an interior of said water bath towards the overflow portions and a carrier supporting portion for supporting said member in a tilted posture when pulling up the member from below the water surface; and a water temperature controller for controlling the water temperature in said pull-up bath.

8. A pull-up drying apparatus according to claim 7, wherein said water temperature control means includes a heater disposed in said pull-up bath, a heater cover for covering said heater from above said heater, an exhaust tube for allowing gas within said heater cover to escape out of said bath, and a heating control device for controlling the heating by said heater.

9. A pull-up drying apparatus according to claim 8, wherein said heater cover is shaped like a lampshade in cross section, and includes a center portion for collecting gas produced in a vicinity of said heater, and wherein said exhaust tube includes an exhaust opening disposed at said center portion.

10. A pull-up drying apparatus according to claim 7, further comprising an air supply device disposed upwardly of said pull-up bath, and wherein an exhaust opening is disposed around the upper end of said pull-up bath.

11. A drying apparatus comprising:
a drainage bath including a drain opening;
a cleaning bath disposed within said drainage bath, said cleaning bath including:
    a pair of opposing first sidewalls; and
    a pair of opposing second sidewalls coupled to said pair of opposing first sidewalls, said pair of opposing first sidewalls being shorter than said pair of opposing second sidewalls so as to form a pair of opposed overflow outlets at an upper portion of said pair of opposing first sidewalls, said overflow outlets being inboard of said drain opening;
a water supply line coupled to said cleaning bath below a surface of water supported therein;
a heater communicating with said water for controlling a water temperature in said cleaning bath; and
a pull-up mechanism operatively associated with said cleaning bath for pulling up a member to be dried from below the surface of the water at a predetermined rate wherein said pull-up mechanism includes a carrier for supporting said member such that a plate surface of said member is perpendicular to said pair of opposing first sidewalls and parallel to a direction the water flows to the overflow outlets of said cleaning bath when said member is placed in said cleaning bath and during cleaning so that the water may flow without stagnation towards the overflow outlets, said carrier supporting said member such that a lower side thereof is tilted when pulled up from said cleaning bath.

12. The apparatus of claim 11 wherein said heater is disposed within said cleaning bath and includes a cover for collecting and redirecting gas produced in a vicinity of said heater.

13. The apparatus of claim 12 further comprising at least one exhaust duct coupled to said cover for directing said gas exterior of said cleaning bath.

14. The apparatus of claim 11 further comprising an air supply device disposed above said cleaning bath for generating an air current flowing downward towards said cleaning bath.

15. A pull-up drying method in which water in a water bath is heated to a predetermined temperature, a member to be dried is placed in the water, and then pulled up at a predetermined speed with one lower side of the member disposed closer to a horizontal plane of a surface of the water than another lower side of the member and with a surface of the member extending perpendicular to a first pair of opposing sidewalls of said water bath which are shorter than a second pair of opposing sidewalls of said water bath and parallel to a direction in which the water flows relative to a pair of opposing overflow portions on an upper end of said first pair of opposing sidewalls of the water bath.

16. A pull-up drying apparatus comprising:
a pull-up bath including:
    a first sidewall;
    a second sidewall coupled to said first sidewall;
    a third sidewall coupled to said second sidewall opposite said first sidewall;
    a fourth sidewall coupled to said first and third sidewall opposite said second sidewall, said second and fourth sidewalls being shorter than said first and third sidewalls so as to form a pair of opposing overflow portions on an upper end of said pull-up bath so as to allow water to overflow from an interior of said pull-up bath;
a drainage bath having a drainage opening at an outer side of said overflow portions of said pull-up bath;
water-supply means for supplying water into said pull-up bath from below a surface of the water;
a member pull-up mechanism for pulling up a member to be dried from below the surface of the water at a predetermined speed, said member pull-up mechanism including a carrier for supporting said member such that a plate surface of the member is perpendicular to said second and fourth sidewalls and parallel to a direction the water flows to the overflow portions when placed in the water so that the water flows without stagnation from an interior of said water bath towards the overflow portions, said carrier also supporting said member in a tilted posture when pulling up the member from below the surface of the water;
a heater disposed in said pull-up bath;
a heater cover for covering said heater;
an exhaust tube for allowing gas within said heater cover to escape out of said bath; and
a heating control device for controlling the heating by said heater.

* * * * *

UNITED STATES PATENT AND TRADEMARK OFFICE
CERTIFICATE OF CORRECTION

PATENT NO. : 6,179,930
DATED : January 30, 2001
INVENTOR(S) : Katsuya Ide et al

It is certified that error appears in the above-identified patent and that said Letters Patent is hereby corrected as shown below:

Col. 7, line 10, "(mm/mim)" should be -- (mm/min)--.

Col. 7, line 43, "tiled" should be --tilted--.

Signed and Sealed this

Fifth Day of June, 2001

Attest:

NICHOLAS P. GODICI

Attesting Officer

*Acting Director of the United States Patent and Trademark Office*